United States Patent [19]

Johnson

[11] Patent Number: 4,521,693
[45] Date of Patent: Jun. 4, 1985

[54] ELECTRO-OPTICAL SOLID-STATE SPDT RELAY SWITCH

[76] Inventor: Alan L. Johnson, P.O. Box 45443, Los Angeles, Calif. 90045

[21] Appl. No.: 439,358

[22] Filed: Feb. 11, 1983

[51] Int. Cl.³ .................. H03K 17/60; H03K 3/42
[52] U.S. Cl. ................... 307/252 T; 307/252 B; 307/311
[58] Field of Search .............. 307/311, 252 B, 252 T, 307/41, 38

[56] References Cited

U.S. PATENT DOCUMENTS

| | | | |
|---|---|---|---|
| 3,484,623 | 12/1969 | Cain | 307/252 B |
| 3,493,783 | 2/1970 | Till | 307/252 B |
| 3,517,217 | 6/1970 | Sleater et al. | 307/252 B |
| 3,900,763 | 8/1975 | Turner | 307/252 B |
| 4,087,848 | 5/1978 | Hyink et al. | 307/252 B |

*Primary Examiner*—Stanley D. Miller
*Assistant Examiner*—B. P. Davis
*Attorney, Agent, or Firm*—J. E. McTaggart

[57] ABSTRACT

An optically-coupled/isolated electronic single pole double throw power relay switch with few parts routes a.c. power to one of two loads in response to a low-level control signal. Two gate-controlled bidirectional thyristors (Triacs) are made to switch in a complementary mode by gate-controlling one Triac from a light-sensitive element, and gate-controlling the other Triac from a gating circuit responsive to voltage appearing across the first Triac in its OFF state.

4 Claims, 3 Drawing Figures

ELECTRO-OPTICAL SOLID-STATE SPDT RELAY SWITCH

BACKGROUND OF THE INVENTION

The present invention relates to the field of optically-coupled/isolated solid-state relay switching circuits for direct connection to conventional 120 volt a.c. power sources; in particular, where a single pole double throw (SPDT) function is required for applying power to either of two loads.

Electro-optical combinations for coupling a controlling signal to a solid-state power switching circuit while isolating the controlling source from power line voltages, in effect forming a SPST (single pole single throw) function, are well known. An example of a light-responsive switching circuit is disclosed in U.S. Pat. No. 3,676,685. Such light-responsive SPST switching circuits may be divided into two categories:

(a) those which apply power to a load only when the light-sensing element is illuminated, and (b) those which apply power to a load only when the light-sensing element is dark.

There is an unsatisfied need for a single solid-state switching circuit capable of performing the function of these two categories (a) and (b) simultaneously, to provide a single pole double throw (SPDT) capability for routing power to one or other of two loads. An obvious method of achieving ths result is to employ two switching circuits, one each of categories (a) and (b) as described above, and apply a common controlling light source to both light-sensing elements. However, such a system carries unnecessary penalties of cost and complexity, as well as a reliability weakness due to the dependancy on two separate light-sensing elements.

SUMMARY OF THE INVENTION

Accordingly, it is an object of this invention to provide an improved light-responsive switching circuit for direct connection to power lines, in which a SPDT power-switching function is achieved.

It is another object of this invention to provide a SPDT solid-state switch which is optically controlled by means of a single light-sensitive element.

It is a further object of this invention to provide an optically-coupled/isolated SPDT switch employing solid-state components which may be encapsulated in a module adapted for direct power-line connection.

It is a further object of this invention to provide an optically-coupled/isolated SPDT solid-state switch which achieves a hitherto unavailable level of performance, reliability, economy and producibility by virtue of its simplicity and elegance.

These and other objects and advantages of the present invention are attained by a circuit comprising a light-sensitive element such as a photo-diac connected resistively to a first power Triac, which serves as a pair of power contacts which are normally open when the light-sensitive element is dark, a voltage-responsive gating element such as a diac connected in a circuit responsive to voltage across the first power Triac and capable of triggering a second power Triac such that is serves as a second pair of contacts which are normally closed when the light-sensitive element is dark. Conversely, when light is applied to the light-sensitive element, the first power Triac turns on, forming closed contacts, and the second power Triac turns off, forming open contacts.

In one embodiment, the circuit is encapsulated in a module wherein the light sensitive element is provided with a window for exposure to light from an external controlling source.

In a second embodiment, the light-sensitive element is part of an enclosed electro-optical coupler/isolator which includes a light-emitting element which is electrically energized, whereby the circuit functions as a SPDT relay actuated by a control current applied to the light-emitting element of the coupler/isolator assembly. In this second embodiment, the module may include additional peripheral control circuitry for driving the light-emitting element from any of a variety of conventional controlling sources, such as a slot machine coin counter, for example.

In both embodiments, there are three terminals rated for a.c. power line duty; these are designated NO (normally open), NC (normally closed) and IN (input), corresponding to the three terminals of a SPDT switch.

BRIEF DESCRIPTION OF THE DRAWINGS

Other objects and advantages of the invention will become apparent from the following detailed description taken in conjunction with the accompanying drawings, wherein.

DETAILED DESCRIPTION OF THE INVENTION

Figure 1:
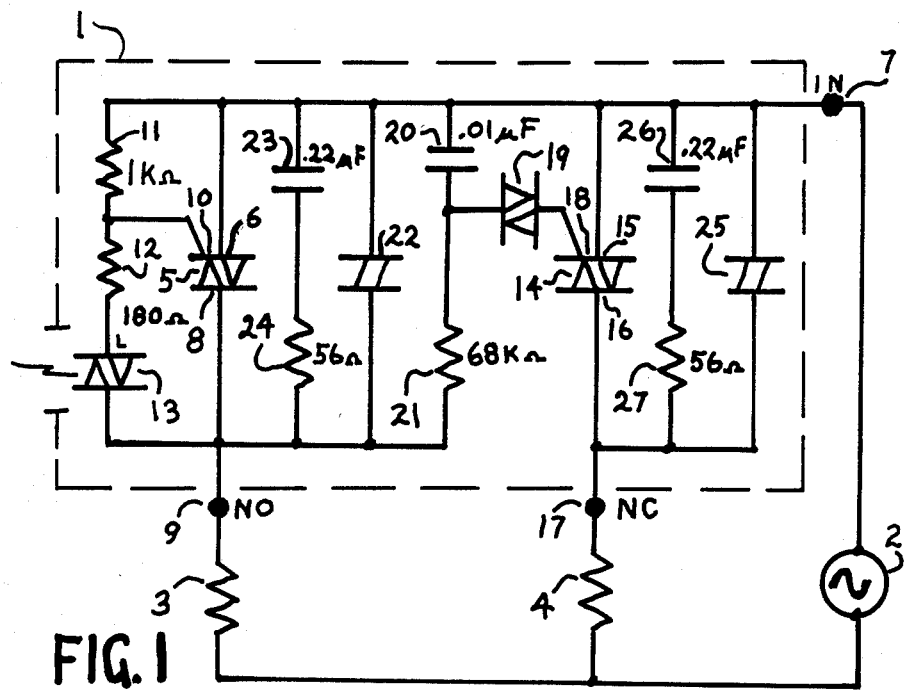
FIG. 1 is a schematic diagram of a SPDT light-responsive circuit designed in accordance with this invention.

Referring to FIG. 1, a switching circuit 1 is connected to an a.c. power source 2 and two loads, 3 and 4.

A first switching element 5, which is a bidirectional triode semiconductor commonly known as a Triac, is connected in a series circuit with power source 2 and load 3. The first Triac 5 has a first anode 6 connected to a first terminal 7, a second anode 8 connected to a second terminal 9, and a gate electrode 10 connected through a first resistor 11 to terminal 7 and through a second resistor 12 in series with light-sensitive element 13 to terminal 9.

A second Triac 14 is connected in a series circuit with power source 2 and load 4. Triac 14 has a first anode 15 connected to power source 2 through terminal 7, a second anode 16 connected to load 4 through terminal 17, and a gate electrode 18 connected to a terminal of a bidirectional avalanche diode device commonly known as a trigger diode or diac 19, whose other terminal is connected to the junction of capacitor 20 and resistor 21. The other terminal of capacitor 21 is connected to terminal 7, and the other terminal of resistor 21 is connected to terminal 9.

Voltage-dependent resistor 22 and the series branch containing capacitor 23 and resistor 24 are connected between terminals 7 and 9, and, similarly, voltage-dependent resistor 25 and the series branch containing capacitor 26 and resistor 27 are connected between terminals 7 and 17 to suppress transient voltage pulses from the a.c. power line and avoid false triggering of Triac 5 or Triac 14.

In the embodiment of FIG. 1, light-sensitive element 13 is a bidirectional light-sensitive avalanche diode, commonly known as a photo-diac. In the absence of light, diac 13 blocks current flow through resistors 11 and 12, consequently gate 10 of Triac 5 is held zero-biased with reference to anode 6, causing Triac 5 to remain in its OFF state, blocking power from reaching load 3 because terminals 7 and 9 are open-circuited. The open circuit voltage appearing across terminals 7 and 9 causes current flow through capacitor 20 and resistor 21: the voltage across capacitor 21 and the corresponding stored energy are sufficient to trigger diac 19 and gate 18 of Triac 14 to its ON state near the start of each a.c. half cycle, thus keeping Triac 14 in its ON state practically continuously, conducting power to load 4 through the closed circuit of terminals 7 and 17. When photo-diac 13 is sufficiently illuminated, it triggers on and conducts sufficient current through resistors 11 and 12 so that the voltage across resistor 11 triggers Triac 5 to its ON condition near the start of each a.c. half cycle, thus Triac 5 is kept turned on practically continuously, effectively holding terminals 7 and 9 closed-circuited, powering load 3. Consequently, with no voltage drop across terminals 7 and 9, there is no current flow through capacitor 20 and resistor 21; no voltage develops across capacitor 20, thus diac 19 fails to trigger gate 18 of Triac 14, which remains in its OFF state, effectively open-circuiting terminals 7 and 17, blocking power fromm reaching load 4.

In summary, the circuit described accomplishes the required SPDT switching function: with element 13 dark only load 4 is powered, while with element 13 illuminated only load 3 is powered.

Figure 2:
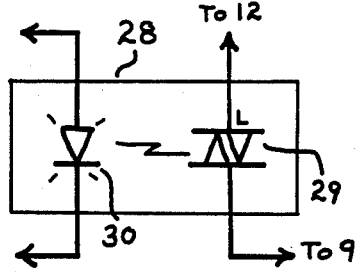
FIG. 2 is a schematic diagram of an electro-optical coupler/isolator for use with the circuit of FIG. 1.

In another embodiment of this invention, it is made to function as an electrical relay by replacing the light-sensitive element 13 in FIG. 1 by the electro-optical coupler/isolater shown in FIG. 2, where the light-sensitive element 29 is a photo-diac enclosed along with an electrical light source 30, whose light energy is dependent on the level of electrical current flowing through it.

Figure 3:
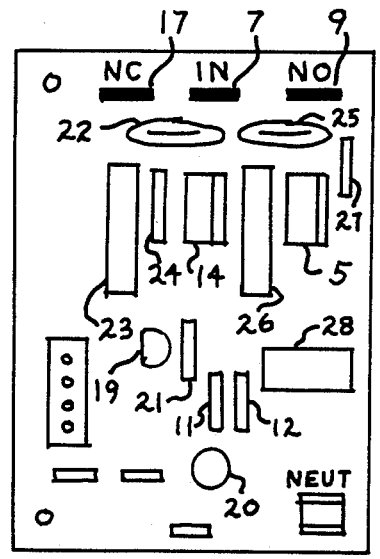
FIG. 3 is a top view in section of a module in which switching circuits of the type disclosed in this invention may be assembled.

It should be apparent that with a level of current above a minimum operating threshold flowing in light source 30, the resultant illumination will trigger photo-diac 29 and Triac 5, powering only load 3; conversely lack of threshold input current will have the result of powering only load 4, in accordance with the detailed description given for the operation of FIG. 1. Thus the circuit of FIG. 2 functions as a SPDT relay responsive to the level of current in light source 30, which may be a light-emitting diode or incandescent lamp. In a particular embodiment illustrative of this invention, assembly 28 is a commercially available module comprising photo-diac 29 and a light-emitting diode as light source 30, both located in an optical enclosure shielded from ambient light. In this embodiment, the switch circuitry and electro-optical coupler/isolator of FIG. 2 are encapsulated in a module as shown in FIG. 3. The module may also contain additional conventional and well-known circuitry, including preamplification and/or logic, for driving light source 30 from particular sensing devices, such as slot machine coin detectors, for example.

This invention is susceptable of various modifications and alternatives: the spirit and scope of this invention are intended to include all such modifications, alternatives and equivalents.

What is claimed is:

1. An electrical a.c. power-switching relay circuit comprising,
   (a) a first power terminal for connecting to an a.c. power source,
   (b) a second power terminal for connecting to a first load,
   (c) a third power terminal for connecting to a second load,
   (d) a first bidirectional switching device having a first anode connected to said first power terminal, a second anode connected to said second power terminal, and a gate connected to light-responsive gating means, and
   (e) a second bidirectional switching device having a first anode connected to said first power terminal, a second anode connected to said third power terminal, and a gate connected to a first terminal of voltage-responsive gating means having a second and third terminal connected to the first and second anode, respectively, of said first bidirectional switching device, wherein said voltage-responsive gating means is responsive to the level of voltage present between the first anode and the second anode of said first bidirectional switching device.

2. The invention as recited in claim 1 wherein said light-responsive gating means comprises a photo-sensitive avalanche diode connected in series with a resistor in a circuit branch having a first end connected to said gate of said first bidirectional switching device and a second end connected to said second power terminal.

3. The invention as recited in claim 2 wherein said light-responsive gating means further comprises an electrically powered light source located in optical co-operation with said light-responsive gating means.

4. The invention as recited in claim 1 wherein said voltage-responsive gating means comprises a capacitor having a first terminal connected to said first anode of said first bidirectional switching device, a resistor having a first terminal connected to said second anode of said first bidirectional switching device and having a second terminal connected to a second terminal of said capacitor, and an avalanche diode having a first terminal connected to said gate of said second bidirectional switching device and having a second terminal connected to said second terminal of said resistor.

* * * * *